United States Patent
Werking

(10) Patent No.: US 7,956,782 B2
(45) Date of Patent: Jun. 7, 2011

(54) CURRENT-MODE SIGMA-DELTA DIGITAL-TO-ANALOG CONVERTER

(75) Inventor: Paul M. Werking, Rockford, MN (US)

(73) Assignee: Honeywell International Inc., Morristown, NJ (US)

( * ) Notice: Subject to any disclaimer, the term of this patent is extended or adjusted under 35 U.S.C. 154(b) by 11 days.

(21) Appl. No.: 12/456,061

(22) Filed: Jun. 11, 2009

(65) Prior Publication Data

US 2010/0315274 A1    Dec. 16, 2010

(51) Int. Cl.
    *H03M 3/00*     (2006.01)
(52) U.S. Cl. ........................................ 341/143; 341/144
(58) Field of Classification Search ................... 341/143, 341/144, 134, 135, 136
See application file for complete search history.

(56) References Cited

U.S. PATENT DOCUMENTS

| | | | |
|---|---|---|---|
| 4,384,274 A | 5/1983 | Mao | |
| 4,683,458 A | 7/1987 | Hallgren | |
| 5,146,224 A | 9/1992 | Kitayoshi | |
| 5,343,197 A | 8/1994 | Kanai et al. | |
| 5,563,597 A | 10/1996 | McCartney | |
| 5,724,039 A | 3/1998 | Hayashi | |
| 5,815,103 A | 9/1998 | Comminges et al. | |
| 5,870,044 A | 2/1999 | Dell'ova et al. | |
| 5,889,484 A | 3/1999 | Noguchi | |
| 5,990,711 A | 11/1999 | Sekimoto | |
| 6,275,179 B1 | 8/2001 | Mori | |
| 6,356,141 B1 | 3/2002 | Yamauchi | |
| 6,433,722 B1 | 8/2002 | Gata et al. | |
| 6,501,409 B1 | 12/2002 | Lynn et al. | |
| 6,583,741 B1 * | 6/2003 | Knudsen ....................... 341/143 |
| 6,593,868 B2 | 7/2003 | Clara et al. | |
| 6,965,333 B1 | 11/2005 | Hsu | |
| 7,256,720 B2 | 8/2007 | Fukuda | |
| 7,277,035 B1 | 10/2007 | You et al. | |
| 7,400,285 B2 | 7/2008 | Nicollini et al. | |
| 7,423,573 B2 | 9/2008 | Baginski et al. | |
| 7,425,909 B2 | 9/2008 | Rose et al. | |
| 7,626,527 B1 * | 12/2009 | Wang et al. ................... 341/143 |
| 7,705,758 B2 * | 4/2010 | Tu et al. ....................... 341/143 |
| 2002/0063648 A1 | 5/2002 | Meroni et al. | |
| 2002/0105454 A1 | 8/2002 | Nanba et al. | |
| 2003/0038740 A1 | 2/2003 | Mulder et al. | |
| 2005/0225464 A1 | 10/2005 | Lin et al. | |
| 2006/0139193 A1 | 6/2006 | Morrow et al. | |

(Continued)

OTHER PUBLICATIONS

U.S. Appl. No. 11/898,533, filed Sep. 12, 2007, entitled "Differential Current-Mode Translator in a Sigma-Delta Digital-to-Analog Converter," Paul M. Werking.

(Continued)

*Primary Examiner* — Peguy JeanPierre
(74) *Attorney, Agent, or Firm* — Shumaker & Sieffert, P.A.

(57) ABSTRACT

In general, this disclosure is directed to a differential current-mode sigma-delta digital-to-analog converter (SD DAC) with improved accuracy and reduced offset and gain errors. In one example, the SD DAC may include a current source configured to provide a differential current. The SD DAC may further include a switching network configured to adjust a polarity of the differential current according to a bit within the bit-stream to produce a differential current signal. The SD DAC may further include a current-to-voltage converter configured to convert the differential current signal to a differential voltage signal. In additional examples, the differential current source may include one or more source degeneration resistances. In further examples, the current-to-voltage converter may include a fully-differential operational amplifier. A low pass filter may be included within the current-to-voltage converter and/or coupled to the output of the current-to-voltage converter.

20 Claims, 7 Drawing Sheets

U.S. PATENT DOCUMENTS

2007/0279105 A1 12/2007 Sunairi
2008/0231335 A1 9/2008 Werking
2009/0016544 A1 1/2009 Li et al.
2010/0164765 A1* 7/2010 Miyahara et al. ............ 341/120

OTHER PUBLICATIONS

N. Ghittori et al., "A low-power, low-voltage (11mW8.4mW, 1.2V) DAC+filter for multistandard (WLAN/UMTS) transmitters," 2005 Symposium on VLSI Circuits Digest of Technical Papers held Jul. 16-18, 2005, 5 pages.

W. Kester, Data Conversion Handbook—p. 420, Walter Allan Kester, Data Conversion Handbook, Analog Devices, Inc.—Technology & Engineering—2005.

D'Amico et al., Low-power reconfigurable baseband block for UMTS/WLAN transmitters, IEEE, Proceedings Norchip Conference 2004, Nov. 2004, pp. 103-106.

* cited by examiner

CURRENT-MODE SIGMA-DELTA DIGITAL-TO-ANALOG CONVERTER

GOVERNMENT RIGHTS

The United States Government has acquired certain rights in this invention pursuant to Contract No. W31P4Q-07-D-0025/0002, awarded by the U.S. Army—AMRDEC—Redstone Arsenal.

TECHNICAL FIELD

This disclosure relates to sigma-delta digital-to-analog converters, and more specifically, to a differential current-mode translator in a sigma-delta digital-to-analog converter.

BACKGROUND

A digital-to-analog converter (DAC) can be characterized by an ideal linear transfer function. Various types of errors may cause the actual transfer function of a DAC to deviate from the ideal linear transfer function. First, offset errors may cause a vertical shift in the linear transfer function resulting in each actual output value being offset by a fixed value from the output values generated by the ideal transfer function. Second, gain errors may cause a shift in the slope of the transfer function resulting in an actual transfer function that is steeper than the ideal transfer function.

Sigma-delta digital-to-analog converters (SD DACs) are often used in mixed signal integrated circuits (ICs) that combine digital and analog circuits on the same substrate. Generally, SD DACs consist of a two-state voltage translator followed by a low-pass filter (LPF). The steady state output voltage of an SD DAC is proportional to the density-of-ones, or equivalent duty cycle, d, of the input data stream.

The two-state voltage translator may generate two different voltages depending upon the value of an incoming digital bit. For example, if the incoming digital bit is a logic one, the voltage translator may generate a first output voltage ($V_P$) corresponding to a high logic value. On the other hand, if the incoming digital bit is a logic zero, the voltage translator may generate a second output voltage ($V_N$) corresponding to a low logic value. An offset error may occur when the first and second output voltages of the translator are not equal. A gain error may occur when the average value of the first and second output voltages is not equal to the external reference voltage.

Current SD DAC designs have gain and offset errors that require correction in order to operate at a high precision. It may be possible to overcome these errors in an SD DAC in the digital domain by slight modifications applied to the density-of-ones pattern of the input data stream. However, making such modifications requires additional digital hardware, firmware, and/or software.

SUMMARY

In general, this disclosure is directed to a differential current-mode sigma-delta digital-to-analog converter (SD DAC) with improved accuracy. The SD DAC includes a current-mode translator coupled to a low-pass filter. The current-mode translator includes a differential current source that feeds a differential current into a differential current-to-voltage converter through a switching network. A differential current may include two separate currents that have substantially equal magnitudes, but opposite polarities. The differential current-to-voltage converter may be configured to regulate the differential inputs of the converter at a voltage level substantially equal to a virtual ground voltage level. This allows the differential current sources to work into low-impedance nodes, which in turn allows for the use of differential current sources with an increased level of current matching. Since gain errors and offset errors within a current-mode SD DAC are dependent upon the level of current matching between the current sources, the increased level of current matching provided by the SD DAC in this disclosure can reduce both types of errors. In this manner, the techniques described in this disclosure provide an SD DAC with improved accuracy and reduced offset and gain errors.

An SD DAC with reduced offset and gain errors generally requires less hardware, firmware, and/or software to compensate for offset and gain errors than would an SD DAC with higher errors. Additionally, in some systems, an SD DAC with reduced offset and gain errors may eliminate the need for any means of correction. Therefore, it is highly desirable to reduce these error terms as much as possible at the translator stage in SD DACs. In some examples, an SD DAC designed in accordance with this disclosure may provide a four-times improvement in both gain errors and offset errors over existing current-mode SD DACs.

Since the SD DAC described in this disclosure allows the currents produced by the differential current source to work into low-impedance nodes, the voltage compliance range for the differential current sources is effectively reduced. A reduced voltage compliance range allows for the use of source degeneration resistances within the current sources. In one example, the resistance values for the source degeneration resistances may be selected such that a level of current matching between the currents produced by the differential current source is dominated by the level of resistance matching between the source degeneration resistances. In other words, the effect of transistor mismatch and other device mismatch on the resulting level of current matching is negligible compared to the effect of resistance mismatch on the resulting level of current matching. Thus, the SD DAC described in this disclosure allows the level of current matching between the differential current sources to be effectively controlled by the level of resistance matching within the current sources. In many circuit fabrication technologies, resistance matching is able to be controlled with a higher degree of precision than transistor device matching. Thus, the differential current source designed in accordance with this disclosure provides an improved level of current matching over prior techniques where transistor device matching dominated the level of current matching.

In one example, the disclosure is directed to a sigma-delta digital-to-analog converter (SD DAC) that includes a differential current source configured to provide a differential current. The differential current source includes one or more source degeneration resistances. The SD DAC further includes a switching network configured to adjust a polarity of the differential current according to a bit within an input bit-stream to produce a differential current signal. The SD DAC further includes a current-to-voltage converter configured to convert the differential current signal to a differential voltage signal.

In another example, the disclosure is directed to a sigma-delta digital-to-analog converter (SD DAC) that includes a sigma-delta modulator configured to modulate a digital signal into a bit-stream. The SD DAC further includes a current source configured to provide a differential current. The SD DAC further includes a switching network configured to adjust a polarity of the differential current according to a bit within the bit-stream to produce a differential current signal. The SD DAC further includes a current-to-voltage converter configured to convert the differential current signal to a differential voltage signal, wherein the current-to-voltage converter comprises a fully-differential operational amplifier.

In another example, the disclosure is directed to a method for converting a digital signal to an analog signal. The method includes generating a differential current comprising a first current and a second current. The first current and the second current are matched to within at least 0.2%. The method further includes adjusting the polarity of the differential current according to a bit within an input bit-stream to produce a differential current signal. The method further includes converting the differential current signal to a differential voltage signal.

In another example, the disclosure is directed to a method for converting a digital signal to an analog signal. The method includes receiving a digital input signal, and applying sigma-delta modulation techniques to the digital input signal to produce a sigma-delta modulated bit-stream. The method further includes generating a differential current. The method further includes adjusting the polarity of the differential current according to a bit within the sigma-delta modulated bit-stream to produce a differential current signal. The method further includes applying the differential current-signal to a fully-differential operational amplifier to convert the differential current signal to a differential voltage signal.

The details of one or more examples are set forth in the accompanying drawings and the description below. Other features, objects, and advantages will be apparent from the description and drawings, and from the claims.

DETAILED DESCRIPTION

In general, this disclosure is directed to a differential current-mode sigma-delta digital-to-analog converter (SD DAC) with improved accuracy and reduced offset and gain errors. As discussed above, current SD DAC designs suffer from gain and offset errors that require correction in order to operate at a high precision. The errors may need to be adjusted using hardware, firmware, and/or software to compensate for the errors. Reducing the offset and gain errors of an SD DAC before implementing a correction means, however, is preferable. The SD DAC in accordance with this disclosure provides an SD DAC with improved uncorrected accuracy by including a current-to-voltage converter with low-impedance input nodes. This allows the differential current source to drive a first and second current into low-impedance nodes, which in turn allows for current source designs with better current matching capabilities. Since gain errors and offset errors are dependent upon current matching levels of the differential current source, an SD DAC designed in accordance with this disclosure reduces gain and offset errors.

Since the SD DAC described in this disclosure allows the differential current sources to work into low-impedance nodes, the voltage compliance range for the differential current sources is effectively reduced. A reduced voltage compliance range allows for the use of source degeneration resistances within the current sources. In one example, the resistance values for the source degeneration resistances may be selected such that a level of current matching between the differential current sources is dominated by the level of resistance matching between the source degeneration resistances. In other words, the effect of transistor mismatch and other device mismatch on the resulting level of current matching is negligible compared to the effect of resistance mismatch on the resulting level of current matching. Thus, the SD DAC described in this disclosure allows the level of current matching between the differential current sources to be effectively controlled by the level of resistance matching within the current sources. In many circuit fabrication technologies, resistance matching is able to be controlled with a higher degree of precision than transistor device matching. Thus, the level of current matching provided by the differential current sources may be improved over prior techniques where transistor device matching dominated the level of current matching.

The following examples provide an SD DAC with reduced offset and gain errors compared to other SD DACs and a method for generating voltages in an SD DAC that results in an SD DAC with reduced gain and offset errors.

Figure 1:
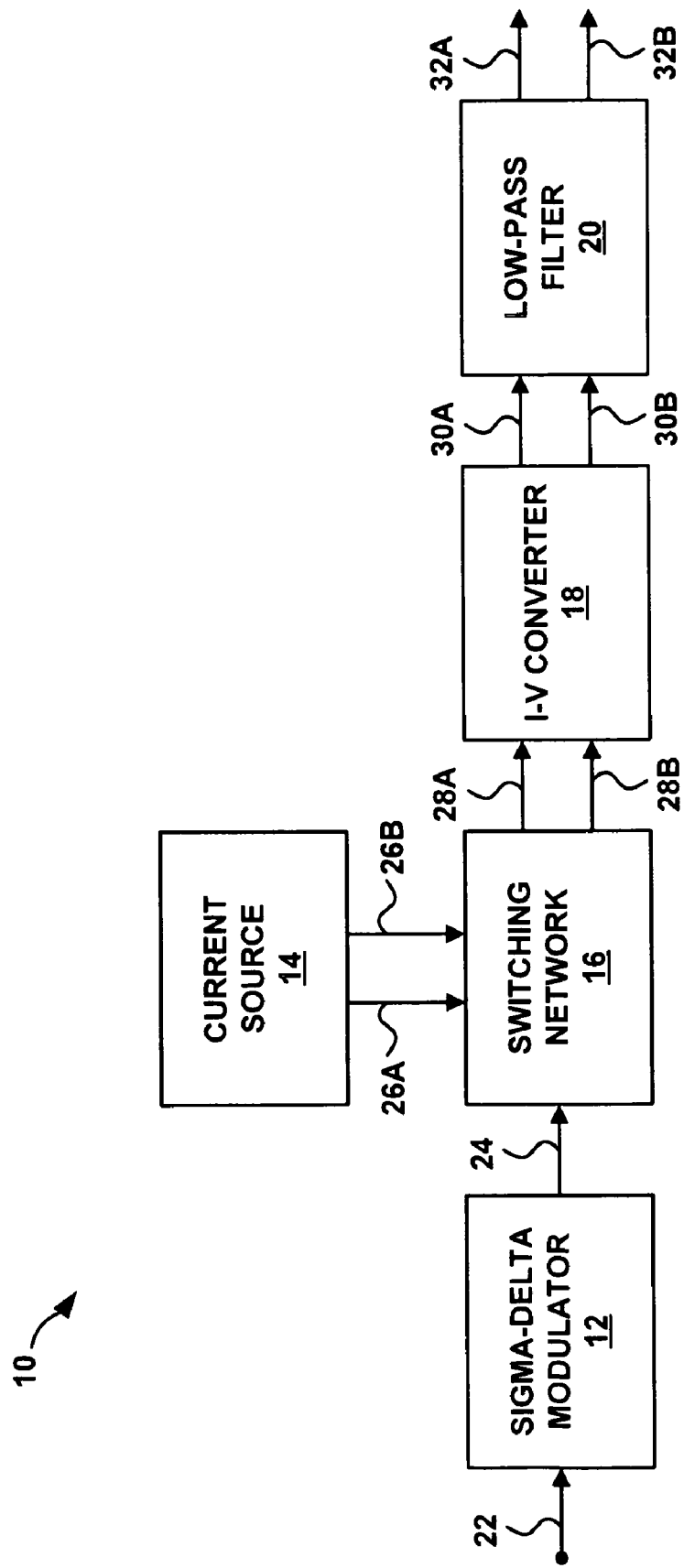
FIG. 1 is a block diagram illustrating an example sigma-delta digital-to-analog converter (SD DAC) system according to this disclosure.

FIG. 1 is a block diagram illustrating an example sigma-delta digital-to-analog converter (SD DAC) system 10 according to this disclosure. SD DAC system converts a digital input signal into an analog output signal representative of the digital input signal. SD DAC 10 includes a sigma-delta (SD) modulator 12, a differential current source 14, a switching network 16, a current-to-voltage converter 18, and a low-pass filter 20.

SD modulator 12 is configured to modulate or transform a digital input signal 22 into a digital bit-stream 24. Digital input signal 22 represents a stream of digital data values that will be converted to an analog output signal by SD DAC system 10. The digital values may be composed any combination of bits that represent a digitized data value. For example, each group of N binary bits within digital input stream 22 may form a digital value. The N binary bits may represent data in various formats known in the art, such as, for example, unsigned binary format or two's complement.

Digital bit-stream 24 is a bit-stream representation of digital input signal 22 designed to control the switching operation of switching network 16. The format of digital bit-stream 24 allows switching network 16 to produce differential currents representative of the digital input signal 22.

SD modulator 12 uses sigma-delta techniques, which are known in the art, to transform digital value 22 into digital bit-stream 24. Thus, transformed digital bit-stream 24 represents the digital values of digital input signal 22 in a density-of-ones format. As used herein, a density-of-ones format refers to a data format where the average value of the bit-stream (i.e., duty cycle) is proportional to the data values represented by the bit-stream. Thus, the proportion or percentage of ones in bit-stream 24 represents a proportion or percentage of the full scale output voltage range of SD DAC system 10. The full scale output voltage range may refer to the range of voltages between a first analog output voltage representing the lowest possible digital value that can be produced by the SD DAC system 10 and a second analog output voltage representing the highest possible digital value that can be produced by SD DAC system 10.

Differential current source 14 is configured to generate a differential current for use by switching network 16. Differential current source 14 provides the differential current through current outputs 26A, 26B. As used herein, a differential current may refer to two different currents that are substantially equal in magnitude, but opposite in polarity. Differential current source 14 may generate the differential current based on a reference voltage supplied to differential current source 14. Differential current source 14 may include one or more source degeneration resistances to control the level of current matching between the current outputs 26A, 26B.

Differential current source 14 may comprise one or more current sources. In one example, differential current source 14 may contain a first current source that provides the first current output 26A and a second current source that provides the second current output 26B. Both the current sources may contain two source degeneration resistances. The level of matching between the first and second current outputs 26A, 26B may be predominately determined by the matching of the source degeneration resistances within each current source. In many circuit fabrication technologies, resistance matching is able to be controlled with a higher degree of precision than transistor device matching. Thus, the differential current source designed in accordance with this disclosure provides an improved level of current matching-over prior techniques where transistor device matching dominated the level of current matching.

Switching network 16 is configured to produce a differential current signal 28A, 28B based on digital bit-stream 24. In one example, switching network 16 may include a first switch that routes current from input 26A to either output 28A or output 28B based on the value of the current bit bit-stream 24. Similarly, switching network 16 may also include a second switch that routes current from input 26B to either output 28A or output 28B based on the value of the current bit in bit-stream 24. Thus, digital bit-stream 24 operates as a control signal that controls the switching of switching network 16. During a single switching cycle, the first and second switches are configured such that the current from output 26A and the current from output 26B are routed to different outputs. In this manner, the first and second switches operate together to selectively adjust the polarity of differential current 28A, 28B according to a bit within an input bit-stream to produce a differential current signal.

In one example, the switching network 16 includes a plurality of transistors. For instance, the switching network 16 may include four (4) transistors. The transistors may operate to direct the current to the resistors based on the value of DIN 24. Additionally or alternatively, the switching network 16 may include transmission gates. For example, the switching network 16 may be a double pole, double throw (DPDT) switch comprised of a plurality of transmission gates. The transmission gates may be Complementary Metal Oxide Semiconductor (CMOS) transmission gates. Other types of switching networks are possible as well.

Current-to-voltage converter 18 is configured to convert a differential current signal 28A, 28B into a differential voltage signal 30A, 30B. In other words, current-to-voltage signal transforms a signal that is represented primarily by current variations into a signal that is represented primarily by voltage variations. Current-to-voltage converter 18 may regulate nodes 28A and 28B at a virtual ground voltage level. In this manner, current-to-voltage converter 18 allows the differential current source 14 and the switching network 16 to drive current into low-impedance nodes.

In one example, current-to-voltage converter 18 may include a fully-differential operational amplifier with substantially identical matched resistance feedback paths. In other words, a first feedback resistance may be coupled between an inverting output of the amplifier and a non-inverting input of the amplifier, and a second feedback resistance, which is matched to the first feedback resistance may be coupled between a non-inverting output of the amplifier and an inverting input of the amplifier. Thus, the substantially identical or balanced feedback regulates nodes 28A and 28B at a virtual ground voltage level.

Low-pass filter 20 filters the differential voltage signal 30A, 30B to produce a filtered differential voltage signal 32A, 32B. The filtered differential voltage signal 32A, 32B provides an analog representation of digital input stream 22. Low-pass filter 20 may be any low-pass filter of any order having any number of poles designed according to known techniques. In one example, low-pass filter 20 may be a four-pole low-pass filter. Although low-pass filter 20 is described above as having differential outputs 32A, 32B, other example low-pass filters may be included within SD DAC system 10 that generate a single-ended output.

In general, the components of SD DAC system 10 work together to convert an input digital signal 22 into an analog output signal 32A, 32B. Differential current source 14, switching network 16, and current-to-voltage converter 18 may be grouped together to form a translator according to this disclosure. In some examples, the translator may be referred to as an SD DAC translator or as an SD DAC.

Figure 2:
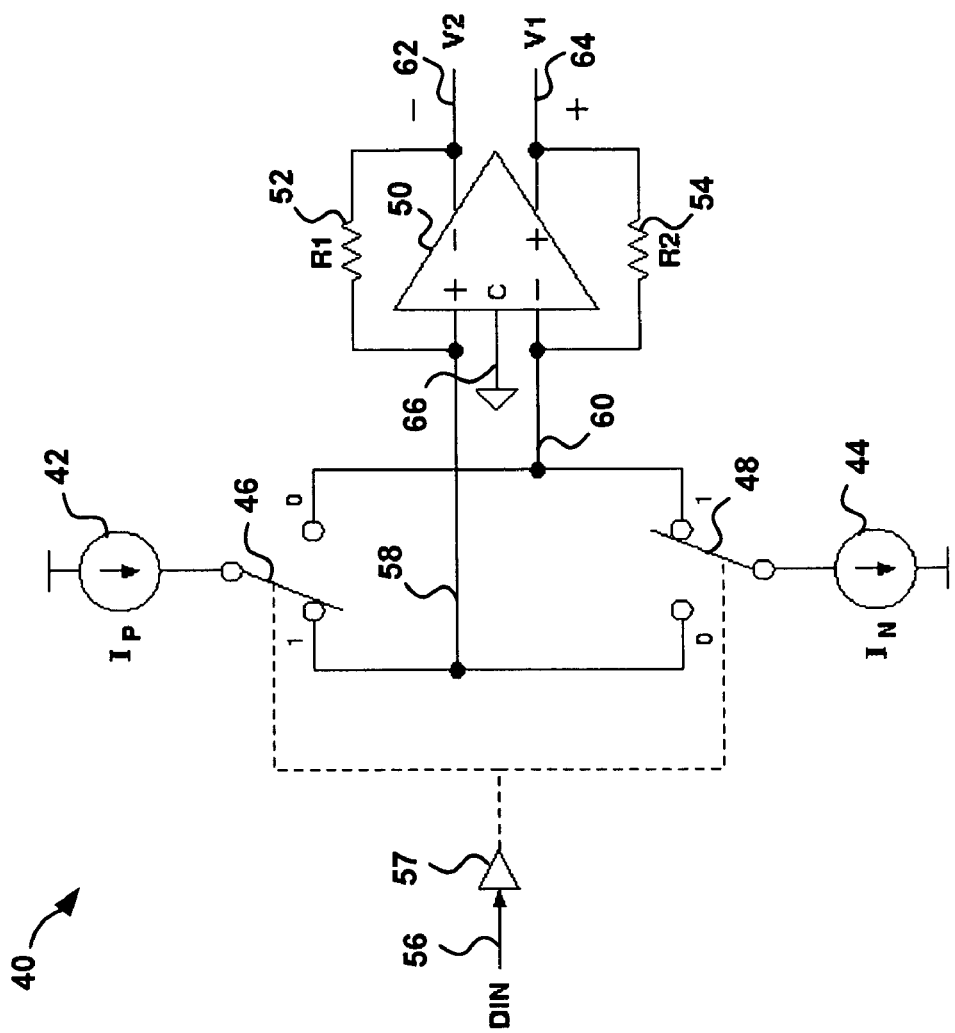
FIG. 2 is a schematic diagram of a current-mode translator for use within the SD DAC system of FIG. 1 according to this disclosure.

FIG. 2 is a schematic diagram of a current mode translator 40 for use within SD DAC system 10 of FIG. 1. Translator 40 includes current sources 42, 44, switches 46, 48, fully-differential operational amplifier 50, resistances 52, 54, digital input 56, driver 57, nodes 58, 60, and outputs 62, 64. A differential current source may be defined to include current sources 42 and 44. A switching network may be defined to include switches 46 and 48. A current-to-voltage converter may be defined to include fully-differential operational amplifier 50, and resistances 52, 54. In some examples, translator 40 may be referred to as an SD DAC.

Current sources 42, 44 generate a constant current level that is fed into switches 46, 48 respectively. In general, the currents generated by current sources 42, 44 may form a differential current. That is, the currents generated by current sources 42, 44 may have substantially equal magnitudes, but different polarities meaning that the currents may flow in opposite directions. According to the example translator 40 of FIG. 2, current source 42 drives current into switch 46 thereby generating a positive current. Similarly, current source 44 extracts current out from switch 48 thereby generating a negative current.

Current sources 42, 44 drive positive and negative current into low-impedance nodes 58 and 60. Thus, current sources 42, 44 may designed to have a relatively restricted voltage compliance range. This allows for current source designs with better current matching between the positive and negative currents generated by current sources 42, 44. In one example, the restricted voltage compliance range for current sources 42, 44 may allow for the use of source degeneration resistances within the current source. If the resistances within the source degeneration resistances are relatively large, then a level of matching between source degeneration resistances substantially controls the level of matching of the currents.

Driver 57 receives digital bit-stream input 56 and drives switches 46, 48 according to bit-stream input 56. Thus, switches 46, 48 are controlled by digital bit-stream input 56. In some examples, driver 57 may be implemented as a buffer or as an inverter.

Digital bit-stream input 56 is composed of individual binary bits. The bits may take on a high logic value (i.e., "logic 1") or a low logic value (i.e., "logic 0"). When the incoming bit 56 is a logic 1, switch 46 routes the output of current source 42 to node 58, and switch 48 routes the output of current source 44 to node 60 as shown in FIG. 2. On the contrary, when the incoming bit 56 is a logic 0, switch 46 routes the output of current source 42 to node 60, and switch 48 routes the output of current source 44 to node 58. In this manner, switches 46, 48 effectively adjust the polarity of an incoming differential current from current sources 42, 44 based on an incoming bit in digital bit-stream 56. The differential current adjusted by switches 46, 48 produces a differential current signal that is applied to nodes 58, 60.

Fully-differential operational amplifier 50 amplifies the differential current signal received on nodes 58, 60. Feedback resistances 52, 54 adjust the gain of the fully-differential amplifier such that the differential current signal received on nodes 58, 60 is effectively converted into a differential voltage signal. The differential voltage signal is applied to nodes 62, 64. Similar to a differential current, a differential voltage may be composed of two voltages that have substantially equal magnitudes, but different polarities.

Resistance 52 is coupled between node 58 and node 62, and resistance 54 is coupled between node 60 and 64. Resistances 52, 54 may comprise resistors or any other material capable of providing an ohmic resistance between two terminals, such as polysilicon resistances. Node 58 feeds into a non-inverting input of operational amplifier 50, and node 60 feeds into an inverting input of operational amplifier 50. Node 64 is a positive differential voltage output of operational amplifier 50, and node 62 is a negative differential voltage output of operational amplifier 50.

Operational amplifier 50 also includes a common mode voltage input 66 that is coupled to ground. The matched resistance negative feedback networks combined with the grounded common mode voltage input produce a virtual ground voltage at both the inverting and non-inverting inputs of operational amplifier 50. In other words, the voltage with respect to absolute ground at the inverting and non-inverting inputs is substantially zero even though the inputs themselves are not coupled to absolute ground.

If the differential gain of operational amplifier 50 is high enough, no additional gain errors are added to the overall DAC response due to operational amplifier 50. Likewise, if the differential offset of operational amplifier 50 is low enough, there are no additional offset errors added to the overall DAC response due to operational amplifier 50.

During operation, translator 40 receives an input bit-stream 56, and switches the currents produced by current sources 42, 44 onto low-impedance nodes 58, 60 based on input bit-stream 56 to produce a differential current signal. Translator 40 then converts the differential current signal to a differential voltage signal and outputs the differential voltage signal onto nodes 62 and 64. Because the matched feedback paths of fully-differential operational amplifier create low-impedance nodes 58, 60, current sources 42, 44 can be designed to have a more restricted or smaller voltage compliance range. This in turn allows for a better current source designs with improved current matching capabilities.

Figure 3:
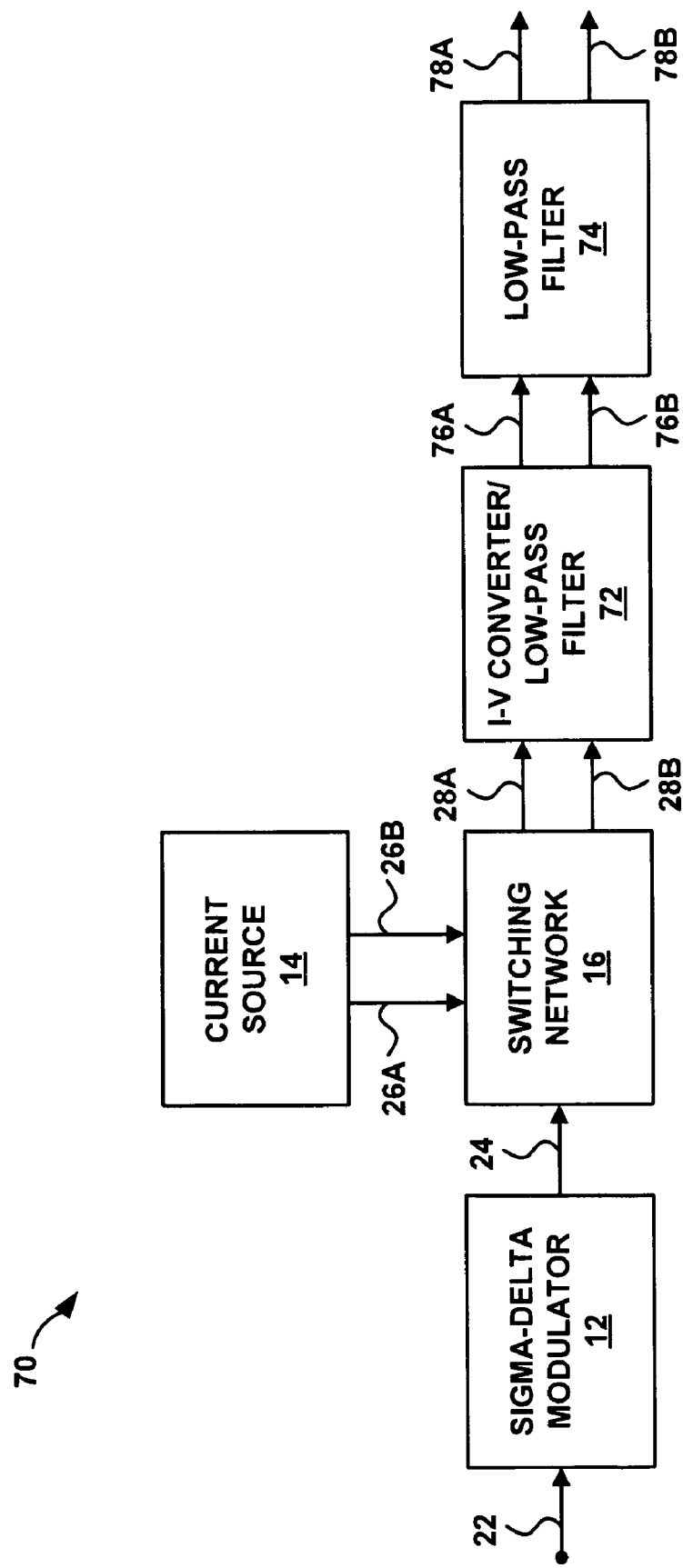
FIG. 3 is a block diagram illustrating another example sigma-delta digital-to-analog converter (SD DAC) system according to this disclosure.

FIG. 3 is a block diagram illustrating another example sigma-delta digital-to-analog converter (SD DAC) system 70 according to this disclosure. SD DAC 70 includes sigma-delta modulator 12, differential current source 14, switching network 16, combined current-to-voltage converter/low-pass filter 72, and low-pass filter 74. Many of the components within SD DAC system 70 correspond to components already described above with respect to SD DAC system 10 of FIG. 1. These corresponding components are identified with identical reference numerals and operate in a manner similar to what has already been described above with respect to SD DAC system 10. Thus, these components will not be described in further detail with respect to SD DAC system 70 of FIG. 3.

Combined current-to-voltage converter/low-pass filter 72 and low-pass filter 74 constitute components that differentiate SD DAC system 70 illustrated in FIG. 3 from SD DAC system 10 illustrated in FIG. 1. Combined current-to-voltage converter/low-pass filter 72 is configured to low-pass filter differential current signal 28A, 28B and generate a filtered differential voltage signal 76A, 76B. Thus, combined current-to-voltage converter/low-pass filter 72 may perform both current-to-voltage conversion functions as well as low pass filtering functions.

In one example, combined current-to-voltage converter/low-pass filter 72 may include a fully-differential operational amplifier with matched resistor-capacitor (RC) feedback loops. In this manner, a single-pole first-order low-pass filter may be created by the addition of two matched capacitors to the existing current-to-voltage converter discussed above with respect to FIG. 2.

Low-pass filter 74 filters the differential voltage signal 76A, 76B to produce a filtered differential voltage signal 78A, 78B. The filtered differential voltage signal 78A, 78B provides an analog representation of digital input stream 22. Low-pass filter 74 may be any low-pass filter of any order having any number of poles designed according to known techniques. In one example, low-pass filter 74 may be a three-pole third-order low-pass filter. When such a low-pass filter is combined with a single-pole first-order low-pass filter within combined current-to-voltage converter/low-pass filter 72, an effective fourth-order low pass filter is created. Although low-pass filter 74 is described above as having differential outputs 78A, 78B, other example low-pass filters may be included within SD DAC system 70 that generate a single-ended output.

SD DAC system 70 allows for the use of a third-order filter between the output of the combined current-to-voltage converter/low-pass filter 72 and the differential voltage outputs of the circuit. In many cases, it is easier to minimize the resistor mismatch in a third-order filter verses a fourth-order filter. Thus, the SD DAC system 70 combines the benefits of a fourth-order filter transfer function with the ease of minimizing resistor mismatch by implementing a first-order design and a third-order filter design.

Figure 4:
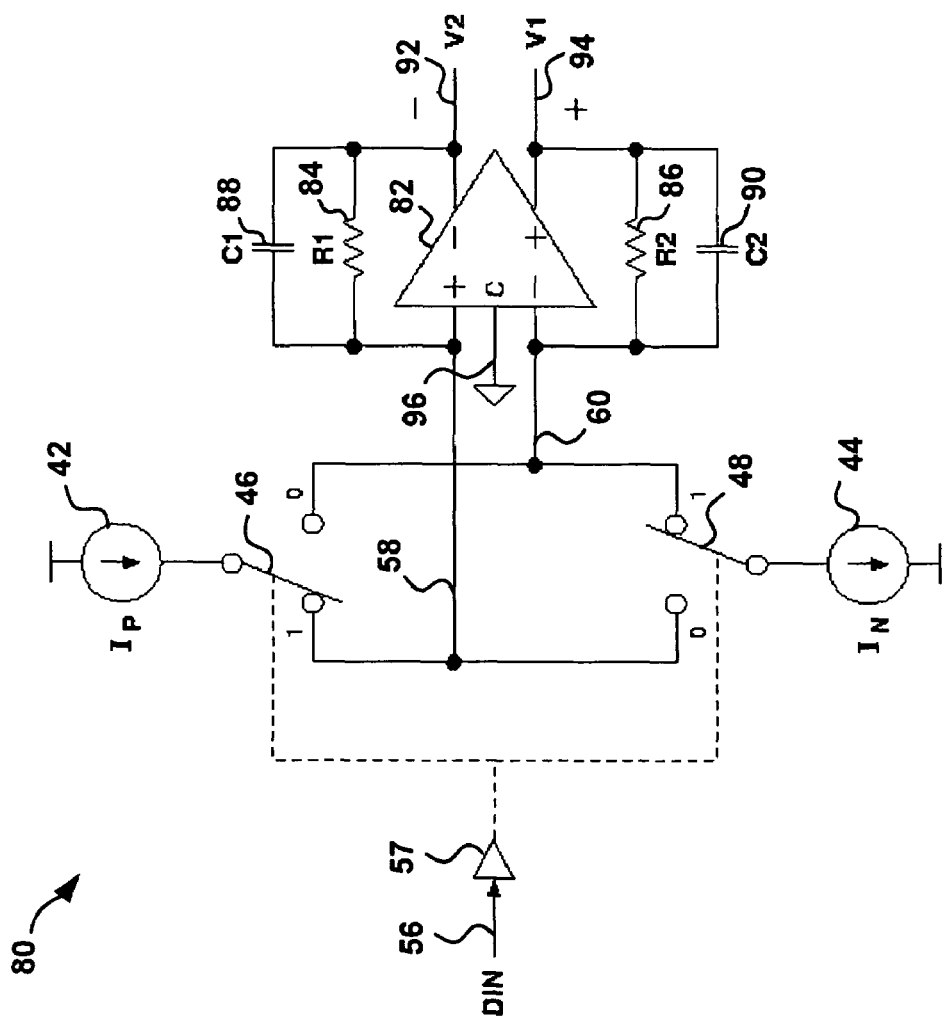
FIG. 4 is a schematic diagram of a current-mode translator for use within the SD DAC system of FIG. 3 according to this disclosure.

FIG. 4 is a schematic diagram of a current-mode translator 80 for use within the SD DAC system of FIG. 3 according to this disclosure. Translator 80 includes current sources 42, 44, switches 46, 48, fully-differential operational amplifier 82, resistances 84, 86, capacitors 88, 90, digital input 56, driver 57, nodes 58, 60, and outputs 92, 94. A differential current source may be defined to include current sources 42 and 44. A switching network may be defined to include switches 46 and 48. A combined current-to-voltage converter/low-pass filter may be defined to include fully-differential operational amplifier 82, resistances 84, 86, and capacitors 88, 90. In some examples, translator 80 may be referred to as an SD DAC.

Many of the components within translator 80 correspond to components already described above with respect to translator 40 of FIG. 2. In particular, the differential current source, switching network correspond to the components having the same name in translator 40 of FIG. 2. These corresponding components are identified with identical reference numerals and operate in a manner similar to what has already been described above with respect to translator 40. Thus, these components will not be described in further detail with respect to translator 80 of FIG. 4.

Fully-differential operational amplifier 82 amplifies the differential current signal received on nodes 58, 60. Feedback resistances 84, 86 and capacitors 88, 90 adjust the gain of fully-differential operational amplifier 82 such that the differential current signal received on nodes 58, 60 is low-pass filtered and converted into a differential voltage signal. The resulting differential voltage signal is applied to nodes 92, 94. Thus, the matched RC negative feedback network causes fully-differential operational amplifier to act as a first-order low pass filter with differential current inputs and differential voltage outputs.

Resistance 84 is coupled between node 58 and node 92, and resistance 86 is coupled between node 60 and 94. Resistances 84, 86 may comprise resistors or any other material capable of providing an ohmic resistance between two terminals, such as polysilicon resistances. Similarly, capacitor 88 is coupled between node 58 and node 92, and capacitor 90 is coupled between node 60 and 94. Node 58 feeds into a non-inverting input of operational amplifier 82, and node 60 feeds into an inverting input of operational amplifier 82. Node 94 is a positive differential voltage output of operational amplifier 82, and node 92 is a negative differential voltage output of operational amplifier 82.

Fully-differential operational amplifier 82 also includes a common mode voltage input 96 that is coupled to ground. The matched resistance negative feedback networks combined with the grounded common mode voltage input produce a virtual ground voltage at both the inverting and non-inverting inputs of operational amplifier 82. In other words, the voltage with respect to absolute ground at the inverting and non-inverting inputs is substantially zero even though the inputs themselves are not coupled to absolute ground.

If the differential gain of operational amplifier 82 is high enough, no additional gain errors are added to the overall DAC response due to operational amplifier 82. Likewise, if the differential offset of operational amplifier 82 is low enough, there are no additional offset errors added to the overall DAC response due to operational amplifier 82.

During operation, translator 80 receives an input bit-stream 56, and switches the currents produced by current sources 42, 44 onto low-impedance nodes 58, 60 based on input bit-stream 56 to produce a differential current signal. Translator 80 then low-pass filters and converts the differential current signal to a differential voltage signal. The low-pass filtering and current-to-voltage conversion may take place simultaneously. Translator 80 outputs the differential voltage signal onto nodes 92 and 94. Because the matched RC feedback paths of fully-differential operational amplifier create low-impedance nodes 58, 60, current sources 42, 44 can be designed to have a more restricted or smaller voltage compliance range. This in turn allows for a better current source designs with improved current matching capabilities.

Figure 5:
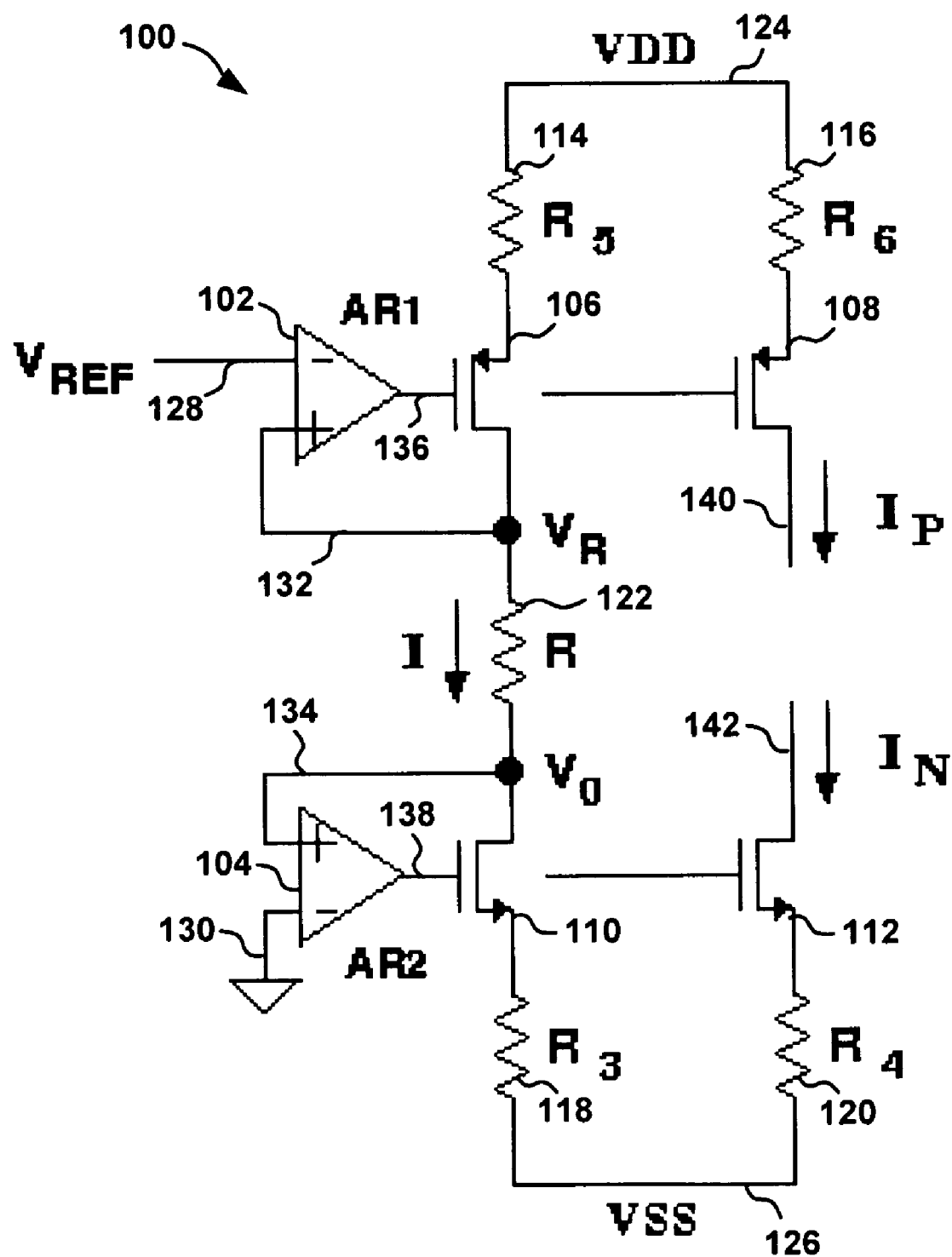
FIG. 5 is a schematic diagram illustrating a differential current source capable of being used in the SD DAC systems of FIGS. 1 and 3 or in the translators of FIGS. 2 and 4 according to this disclosure.

FIG. 5 is a schematic diagram illustrating a differential current source 100 capable of being used in the SD DAC systems of FIGS. 1 and 3 or in the translators of FIGS. 2 and 4 according to this disclosure. Differential current source 100 may include operational amplifiers 102, 104, transistors 106, 108, 110, 112, source degeneration resistances 114, 116, 118, 120, resistance 122, and power supply rails 124, 126. A first current source may be defined to include operational amplifier 102, transistors 106, 108, and source degeneration resistances 114, 116. A second current source may be defined to include operational amplifier 104, transistors 110, 112, and source degeneration resistances 118, 120. In some examples, the first and second current sources may be referred to as current mirrors.

Operational amplifiers 102, 104 are configured to regulate the voltages at nodes 132 and 134. In particular, operational amplifier 102 regulates the voltage of node 132 such that the resulting voltage with respect to ground is substantially equal to a reference voltage ($V_{REF}$). The reference voltage may be generated internally or, as illustrated in FIG. 5, be received as an external input into differential current source 100. The input reference voltage is coupled to the inverting input of operational amplifier 102 via input node 128. The output of operational amplifier 102 (i.e., node 136) is coupled to the gate terminals of transistors 106 and 108. The drain of transistor 106 is coupled to the non-inverting input of operational amplifier 128 as feedback. Thus, operational amplifier 102 drives (i.e., adjusts) the gate voltage of transistor 106 to regulate the voltage at node 132 to be substantially equal to the reference voltage.

Similarly, operational amplifier 104 regulates the voltage of node 134 such that the resulting voltage with respect to ground is substantially equal to a ground voltage. The ground is coupled to the inverting input of operational amplifier 104 via node 130. The output of operational amplifier 104 (i.e., node 138) is coupled to the gate terminals of transistors 110 and 112. The drain of transistor 110 is coupled to the non-inverting input of operational amplifier 128 as feedback. Thus, operational amplifier 104 drives (i.e., adjusts) the gate voltage of transistor 110 to regulate the voltage at node 132 to be substantially equal to the ground voltage.

Node 132 is coupled to node 134 via resistance 122. Since node 132 is regulated at a first voltage with respect to ground (i.e., $V_{REF}$) and node 134 is regulated at a second voltage with respect to ground (i.e. zero volts), a current (I) is formed through resistance 122, which is approximately equal to $V_{REF}/R$, where R is the resistance value of resistance 122.

The source terminal of transistor 106 is coupled to one terminal of source degeneration resistance 114, and the source terminal of transistor 108 is coupled to one terminal of source degeneration resistance 116. The other terminals of source degeneration resistances 114 and 116 are coupled to power supply rail 124. In one example, power supply rail 124 supplies a positive power voltage (i.e., VDD). Similarly, source terminal of transistor 110 is coupled to one terminal of source degeneration resistance 118, and the source terminal of transistor 112 is coupled to one terminal of source degeneration resistance 120. The other terminals of source degeneration resistances 118 and 120 are coupled to power supply rail 126. In one example, power supply rail 126 supplies a negative power voltage (i.e., VSS).

As already described above, operational amplifier 102, transistors 106, 108, and source degeneration resistances 114, 116 form a first current mirror, and operational amplifier 104, transistors 110, 112, and source degeneration resistances 118, 120 form a second current mirror. Thus, the first current mirror generates a first current ($I_P$) at the drain terminal 140 of transistor 108 that is proportional to the current (I) flowing through resistance 122. Similarly, the second current mirror generates a second current ($I_N$) at the drain terminal 142 of transistor 112 that is proportional to the current (I) flowing through resistance 122. In one example, the first and second current mirror may generate the currents such that the proportionality constant is equal to one. That is, the first and second current mirrors may generate the first and second currents such that they are both substantially equal to the current (I). As shown in FIG. 5 the polarity of the first current may be opposite the polarity of the second current. Thus, the first and second current outputs may form a differential current.

Transistors 110, 112 may be implemented as n-type metal-oxide-semiconductor (NMOS) transistors, and transistors 106, 108 may be implemented as p-type metal-oxide-semiconductor (PMOS) transistors. It should be noted, however, that npn-type bipolar junction transistors (npn-BJTs) and pnp-type bipolar junction transistors (pnp-BJTs) may be substituted for one or more of the nMOS transistors and the pMOS transistors. In such cases, it is understood that, when this disclosure refers to the gate terminal of a MOS transistor, the disclosure may also be referring to the base terminal of a BJT. Similarly, when the disclosure refers to the source terminal or the drain terminal of a MOS transistor, the disclosure may also be referring to the emitter terminal or the collector terminal of a BJT respectively.

In the translators of FIGS. 2 and 4 of this disclosure, gain errors and offset errors are dependent upon a level of matching of the magnitudes of the positive and negative currents that are generated by the differential current source. In integrated circuits, the actual magnitudes of the positive and negative currents generated by a differential current source may not always be precisely equal. In other words, the actual integrated circuit may have some degree of current mismatch. Thus, it is possible for the magnitude of the current to deviate in a positive direction and a negative direction by a maximum amount (i.e., $\Delta I$). The level of matching between the magnitudes of the positive and negative currents may be defined as a percentage error between the worst case positive deviation and the worst case negative deviation. Thus, the level of current matching may be expressed according to the following equation: $\Delta I/I$, where I is the ideal current value and $\Delta I$ is the maximum current deviation in a given direction.

Similar to the current mismatch discussed above, actual integrated circuits may also have component mismatches, such as, for example, resistance and transistor mismatch. These mismatches may be the result of one or more parameter mismatches within the device. For example, resistance mismatch may occur because of a mismatch of the resistance parameter. As another example, transistor mismatch may occur because of a mismatch in one or more transistor parameters, such as the threshold voltage (i.e., $V_T$) or transistor sizing ratios (i.e., W/L). The device mismatch may be calculated in a similar fashion to the current mismatch except that the maximum device parameter deviation in one direction is substituted for the maximum current deviation, and the ideal device parameter is substituted for the ideal current.

When the source degeneration resistances 114, 116, 118, 120 of FIG. 5 are large enough, the level of current matching produced by differential current source 100 is predominately controlled by the level of matching of resistances between source degeneration resistances 114, 116, 118, 120. In one example, the level of current matching between the first and second currents produced at terminals 140, 142 is substantially equal to the maximum of the level of resistance matching between source degeneration resistances 114 and 116 and the level of resistance matching between source degeneration resistances 118 and 120. In some prior art differential current sources, the level of current matching was predominately dependent upon the level of transistor parameter matching. In many circuit fabrication technologies, however, resistance matching is able to be controlled with a higher degree of precision than transistor device matching. Thus, the level of current matching provided by differential current source 100 may be improved over prior techniques where transistor device matching dominated the level of current matching.

In addition, if both operational amplifiers 102, 104 in FIG. 5 are of the same design, then the systematic operational amplifier offset voltages will cancel during operation. For example, let the operational amplifier offset voltage between the inverting and non-inverting input terminals be represented by $V_{OF}$. By inspection, $V_0 = V_{OF}$ and $V_R = V_{REF} + V_{OF}$. Therefore, the voltage across resistor R is $V_R - V_0 = V_{REF} + V_{OF} - V_{OF} = V_{REF}$. Thus, when designed with matching operational amplifiers 102, 104, differential current source 100 may provide a voltage across resistor 122 that matches input reference voltage 128 and is not affected by operational amplifier offset voltages. This allows for more precise control over the level of current through resistor 122.

The gain error and the offset error for the translators of FIGS. 2 and 4 may be expressed as follows:

$$E_G = \pm \Delta I \Delta R / IR \qquad (1)$$

$$E_{OF} = \pm 2 \Delta I \Delta R / IR \qquad (2)$$

where $E_G$ represents the gain error, $E_{OF}$ represents an offset error, I represents an ideal current magnitude for the two substantially equal currents of opposite sign generated by the differential current source, $\Delta I$ represents a maximum deviation of current magnitude in either a positive or negative direction from the ideal current magnitude for each of these currents, R represents an ideal resistance for the two substantially matching fully-differential operational amplifier feedback resistances, and $\Delta R$ represents a maximum deviation of resistance in either a positive or negative direction from the ideal resistance for each of these resistors. An example derivation for equations (1) and (2) is provided in U.S. patent application Ser. No. 11/898,533, filed Sep. 12, 2007 by Paul M. Werking, entitled "DIFFERENTIAL CURRENT-MODE TRANSLATOR IN A SIGMA-DELTA DIGITAL-TO-ANALOG CONVERTER."

The translators of FIGS. 2 and 4 of this disclosure are designed to improve the level of current matching (i.e., $\Delta I/I$). Consider a realistic example of prior art techniques where the current sources must drive into high impedance nodes. In such a case, the current sources must be able to handle a large voltage compliance range, which can result in current source designs where the level of current matching is predominately determined by transistor device matching.

With sufficient area and careful layout, it is possible to make an NMOS current mirror with 0.4% matching of the input and output currents. In the same way, one can make a PMOS current mirror with 0.4% matching. Since $I_N$ is within 0.4% of I, and $I_P$ is within 0.4% of I, then $I_P$ and $I_N$ must be within 0.8% of each other. In other words, it is possible to achieve a current source matching level of about 0.8%, or $\Delta I/I = 0.4\%$. If the resistance matching is 0.2%, or $\Delta R/R = 0.1\%$, then the gain error of the SD DAC translator is about ±4 parts per million (ppm) and an offset error of the translator is about ±8 ppm.

Since the SD DAC translators designed in accordance with this disclosure includes current-to-voltage converters with low-impedance input nodes, it is possible to reduce these errors. In particular, the voltages range required to be produced by the current source for proper functioning of the current-to-voltage converter and the low-pass filter is effectively reduced. If the current source outputs are not required to operate over a wide range of voltages, this allows a differential current source to be designed where the level of current matching is predominately determined by resistance device matching.

In particular, it is possible to make the source degeneration resistors shown in FIG. 5 very large. The net result is that current matching is dominated by R3-R4 matching for the NMOS mirror and R5-R6 matching for the PMOS mirror. Consequently, each current mirror has 0.1% matching rather than 0.4% matching and the two currents, $I_P$ and $I_N$, match to within 0.2% of each other. In other words, $\Delta I/I=0.1\%$ and the resultant gain error becomes about ±1 ppm and the resultant offset error becomes about ±2 ppm. Thus, an improvement of four times may be achieved for both types of errors.

Figure 6:
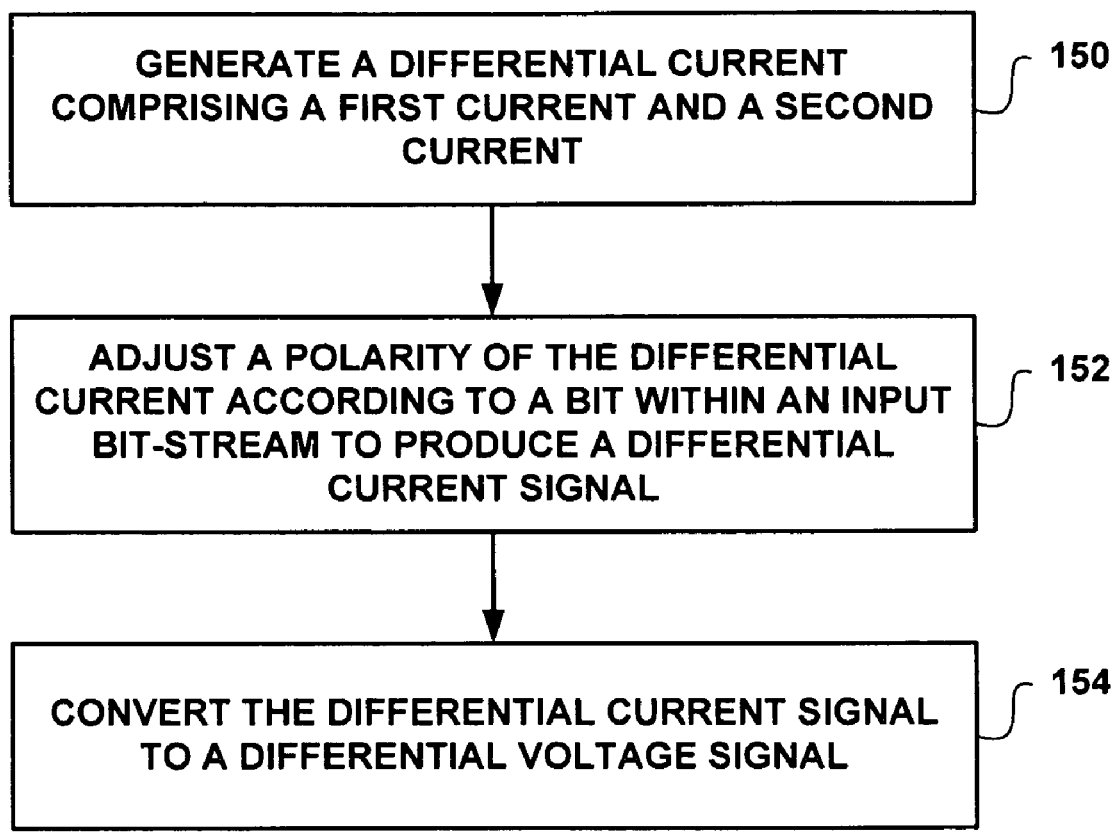
FIG. 6 is a flow-chart illustrating an example method for converting a digital signal to an analog signal according to this disclosure.

FIG. 6 is a flow-chart illustrating an example method for converting a digital signal to an analog signal according to this disclosure. Although described with respect to SD DAC system 10 of FIG. 1, the techniques depicted in FIG. 6 may be implemented in any of the devices and systems of FIGS. 1-4. Differential current source 14 generates a differential current comprising a first current and a second current (150). In some examples, the first current and the second current are matched to within at least about 0.2%. Switching network 16 adjusts a polarity of the differential current according to a bit within an input bit-stream to produce a differential current signal (152). Current-to-voltage converter 18 converts the differential current signal to a differential voltage signal. In some examples, current-to-voltage converter 18 may also low-pass filter the differential current signal.

Figure 7:
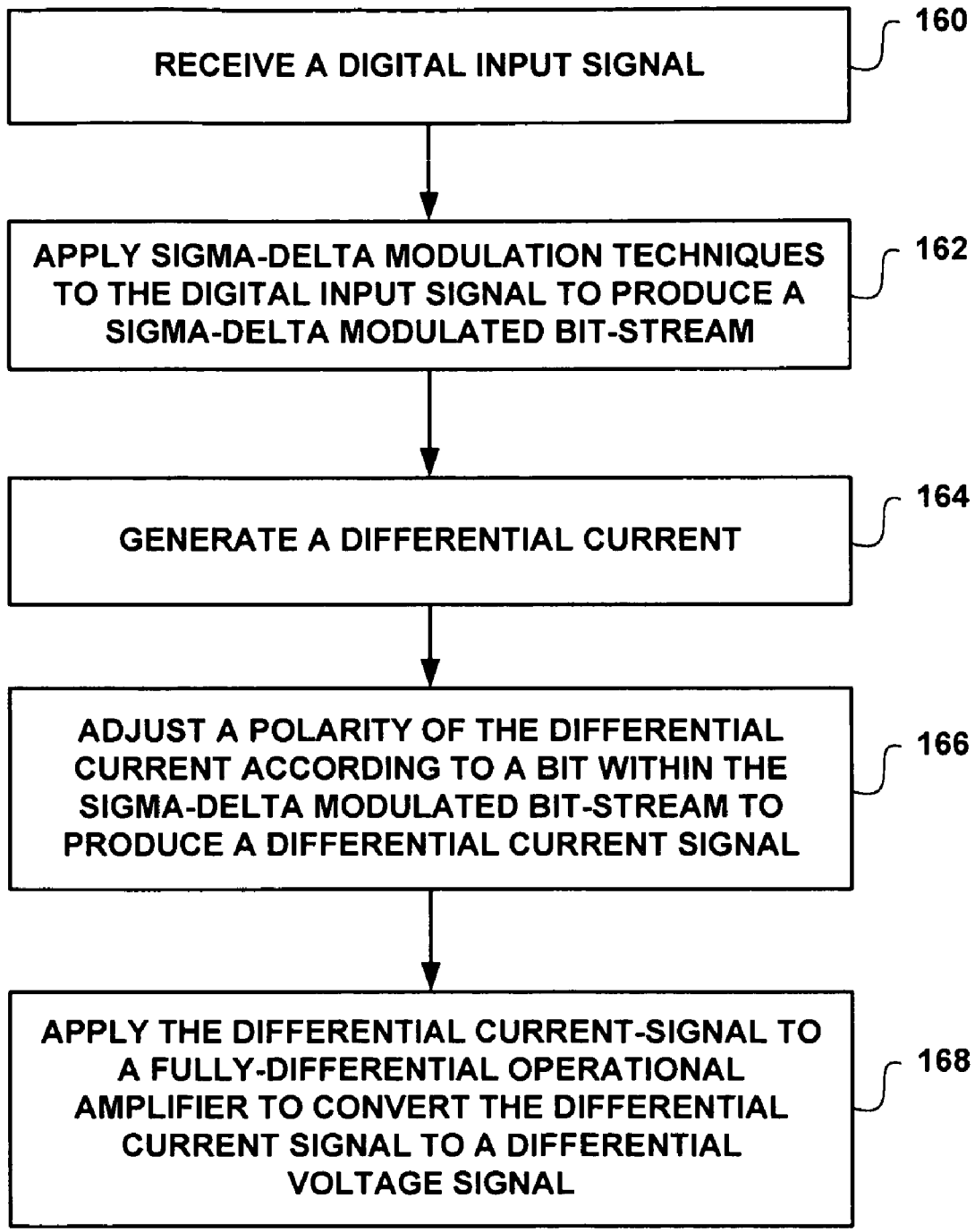
FIG. 7 is a flow-chart illustrating another example method for converting a digital signal to an analog signal according to this disclosure.

FIG. 7 is a flow-chart illustrating another example method for converting a digital signal to an analog signal according to this disclosure. Although described with respect to SD DAC system 10 of FIG. 1, the techniques depicted in FIG. 6 may be implemented in any of the devices and systems of FIGS. 1-4. Sigma-delta modulator 12 receives a digital input signal (160), and applies sigma-delta modulation techniques to the digital input signal to produce a sigma-delta modulated bit-stream (162). Differential current source 14 generates a differential current (164). Switching network 16 adjusts a polarity of the differential current according to a bit within the sigma-delta modulated bit-stream to produce a differential current signal (166). Current-to-voltage converter 18 applies the differential current-signal to a fully-differential operational amplifier to convert the differential current signal to a differential voltage signal (168). In some examples, current-to-voltage converter 18 may also low-pass filter the differential current signal.

An SD DAC in accordance with an embodiment of the present invention may be implemented on CMOS (Complementary Metal Oxide Semiconductor) ICs for superior voltage accuracy. An SD DAC with such accuracy may be useful in many different types of systems. In one example, this SD DAC may be particularly suited to Micro Electromechanical System (MEMS) based accelerometers. The SD DAC in accordance with an embodiment of the invention may preferably be used in a variety of additional signal processing applications. For instance, the SD DAC may be used in audio applications, video applications, machine control, and automatic control systems. Other applications are possible as well.

The invention claimed is:

1. A sigma-delta digital-to-analog converter (SD DAC) comprising:
   a current source configured to generate a differential current, wherein the current source comprises one or more source degeneration resistances;
   a switching network configured to adjust a polarity of the differential current according to a bit within an input bit-stream to produce a differential current signal; and
   a current-to-voltage converter configured to convert the differential current signal to a differential voltage signal.

2. The SD DAC of claim 1, wherein the current-to-voltage converter is further configured to low-pass filter the differential current signal to generate the differential voltage signal.

3. The SD DAC of claim 1, wherein the current-to-voltage converter comprises a fully-differential operational amplifier, a first resistance coupled between a first input and a first output of the fully-differential operational amplifier, and a second resistance coupled between a second input and a second output of the fully-differential operational amplifier.

4. The SD DAC of claim 3, wherein the current-to-voltage converter further comprises a first capacitance coupled between the first input and the first output of the fully-differential operational amplifier, and a second capacitance coupled between the second input and the second output of the fully-differential operational amplifier.

5. The SD DAC of claim 1, wherein the differential current comprises a first current and a second current, and wherein the current source further comprises:
   a first current source configured to generate the first current, wherein the first current source comprises a first source degeneration resistance and a second source degeneration resistance; and
   a second current source configured to generate the second current, wherein the second current source comprises a third source degeneration resistance and a fourth source degeneration resistance.

6. The SD DAC of claim 5, wherein a current matching level between the first current and the second current is a function of a first resistance matching level between the first source degeneration resistance and the second source degeneration resistance and a second resistance matching level between the third source degeneration resistance and the fourth source degeneration resistance.

7. The SD DAC of claim 6, wherein the function comprises a summation of the first resistance matching level and the second resistance matching level to produce the current matching level.

8. The SD DAC of claim 5, wherein the first current source comprises a first transistor and a second transistor, wherein the second current source comprises a third transistor and a fourth transistor, wherein a resistance is coupled between a drain terminal of the first transistor and a drain terminal of the third transistor, wherein a first voltage with respect to a ground potential is applied to the drain terminal of the first transistor, wherein a second voltage with respect to the ground potential is applied to the drain terminal of the third transistor, and wherein the first voltage is different from the second voltage.

9. The SD DAC of claim 5, wherein the first current source further comprises a first operational amplifier having an output coupled to a gate terminal of a first transistor and a gate terminal of a second transistor, a non-inverting input coupled to a drain terminal of the first transistor, an inverting input coupled to a reference voltage node, wherein the first current is applied through a drain terminal of the second transistor, wherein the second current source further comprises a second operational amplifier having an output coupled to a gate terminal of a third transistor and a gate terminal of a fourth transistor, a non-inverting input coupled to a drain terminal of the third transistor, and an inverting input coupled to a ground node, and wherein the second current is applied through a drain terminal of the fourth transistor.

10. The SD DAC of claim 1, wherein the differential current comprises a first current and a second current, and wherein the current source further comprises a first transistor and a second transistor, and wherein a current matching level between the first current and the second current is less than a transistor matching level between the first transistor and the second transistor.

11. The SD DAC of claim 1, wherein each of the one or more source degeneration resistances is coupled between a source of a transistor and a power supply rail.

12. The SD DAC of claim 1, wherein the differential current comprises a first current and a second current, and wherein the switching network comprises a first switch configured to supply the first current alternatively between a first input and a second input of the current-to-voltage converter based on the bit within the input bit-stream, and a second switch configured to supply the second current alternatively between the first input and the second input of the current-to-voltage converter based on the bit within the input bit-stream.

13. The SD DAC of claim 1, further comprising a sigma-delta modulator configured to modulate a digital value into the input bit-stream.

14. The SD DAC of claim 1, further comprising a low-pass filter configured to low-pass filter the differential voltage signal.

15. The SD DAC of claim 1, wherein the differential current comprises a first current and a second current, and wherein the first current and the second current are matched to within at least about 0.2%.

16. The SD DAC of claim 1, wherein the differential current comprises a first current and a second current, and wherein a resistance matching level between at least two of the one or more source degeneration resistances controls a current matching level between the first current and the second current.

17. A sigma-delta digital-to-analog converter (SD DAC) comprising:
- a sigma-delta modulator configured to modulate a digital signal into a bit-stream;
- a current source configured to generate a differential current;
- a switching network configured to adjust a polarity of the differential current according to a bit within the bit-stream to produce a differential current signal; and
- a current-to-voltage converter configured to convert the differential current signal to a differential voltage signal, wherein the current-to-voltage converter comprises a fully-differential operational amplifier.

18. The SD DAC of claim 17, wherein the current-to-voltage converter further comprises a first resistance coupled between a first input and a first output of the fully-differential operational amplifier, and a second resistance coupled between a second input and a second output of the fully-differential operational amplifier.

19. The SD DAC of claim 17, wherein the current-to-voltage converter is further configured to low-pass filter the adjusted differential current to produce a low-pass filtered differential voltage.

20. A method for converting a digital signal to an analog signal comprising:
- generating a differential current comprising a first current and a second current, wherein the first current and the second current are matched to within at least 0.2%;
- adjusting the polarity of the differential current according to a bit within an input bit-stream to produce a differential current signal; and
- converting the differential current signal to a differential voltage signal.

* * * * *